(12) United States Patent
Krebs et al.

(10) Patent No.: US 8,880,384 B2
(45) Date of Patent: *Nov. 4, 2014

(54) ARTIFACT REDUCTION IN ITERATIVE INVERSION OF GEOPHYSICAL DATA

(71) Applicant: ExxonMobil Upstream Research Company, Houston, TX (US)

(72) Inventors: Jerome R. Krebs, Houston, TX (US);
Sunwoong Lee, Houston, TX (US);
Young Ho Cha, Houston, TX (US)

(73) Assignee: ExxonMobil Upstream Research Company, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/192,497

(22) Filed: Feb. 27, 2014

(65) Prior Publication Data

US 2014/0180656 A1 Jun. 26, 2014

Related U.S. Application Data

(63) Continuation of application No. 13/045,215, filed on Mar. 10, 2011, now Pat. No. 8,694,299.

(60) Provisional application No. 61/332,463, filed on May 7, 2010.

(51) Int. Cl.
| | | |
|---|---|---|
| *G06G 7/48* | (2006.01) | |
| *G06F 17/10* | (2006.01) | |
| *G06F 7/60* | (2006.01) | |
| *G06F 17/50* | (2006.01) | |
| *G01V 1/00* | (2006.01) | |
| *G01V 11/00* | (2006.01) | |
| *G06T 11/00* | (2006.01) | |

(52) U.S. Cl.
CPC .............. *G06F 17/5009* (2013.01); *G01V 1/00* (2013.01); *G06T 11/006* (2013.01); *G01V 11/00* (2013.01)
USPC ......................... 703/10; 703/2; 703/6; 702/11

(58) Field of Classification Search
CPC ......... G06F 17/16; G06F 17/17; G06F 17/18; G06T 5/001
USPC ........................................................ 703/6, 2
See application file for complete search history.

(56) References Cited

U.S. PATENT DOCUMENTS

| 3,812,457 A | 5/1974 | Weller |
| 3,864,667 A | 2/1975 | Bahjat |

(Continued)

FOREIGN PATENT DOCUMENTS

| EP | 1 094 338 | 4/2001 |
| EP | 1 746 443 | 1/2007 |

(Continued)

OTHER PUBLICATIONS

Ernst et al, Geophysics, vol. 72, No. 5, Sep.-Oct. 2007, pp. 153-164.*

(Continued)

*Primary Examiner* — Mary C Jacob
(74) *Attorney, Agent, or Firm* — ExxonMobil Upstream Research Company

(57) ABSTRACT

Method for reducing artifacts in a subsurface physical properties model (120) inferred by iterative inversion (140) of geophysical data (130), wherein the artifacts are associated with some approximation (110) made during the iterative inversion. In the method, some aspect of the approximation is changed (160) as the inversion is iterated such that the artifacts do not increase by coherent addition.

13 Claims, 6 Drawing Sheets

(56) References Cited

U.S. PATENT DOCUMENTS

| | | | |
|---|---|---|---|
| 4,159,463 A | 6/1979 | Silverman | |
| 4,168,485 A | 9/1979 | Payton et al. | |
| 4,545,039 A | 10/1985 | Savit | |
| 4,562,540 A | 12/1985 | Devaney | |
| 4,575,830 A | 3/1986 | Ingram et al. | |
| 4,594,662 A | 6/1986 | Devaney | |
| 4,636,956 A | 1/1987 | Vannier et al. | |
| 4,675,851 A | 6/1987 | Savit et al. | |
| 4,686,654 A | 8/1987 | Savit | |
| 4,707,812 A | 11/1987 | Martinez | |
| 4,715,020 A | 12/1987 | Landrum, Jr. | |
| 4,766,574 A | 8/1988 | Whitmore et al. | |
| 4,780,856 A | 10/1988 | Becquey | |
| 4,823,326 A | 4/1989 | Ward | |
| 4,924,390 A | 5/1990 | Parsons et al. | |
| 4,953,657 A | 9/1990 | Edington | |
| 4,969,129 A | 11/1990 | Currie | |
| 4,982,374 A | 1/1991 | Edington et al. | |
| 5,012,193 A * | 4/1991 | Chen | 324/366 |
| 5,260,911 A | 11/1993 | Mason et al. | |
| 5,469,062 A | 11/1995 | Meyer, Jr. | |
| 5,583,825 A | 12/1996 | Carrazzone et al. | |
| 5,677,893 A | 10/1997 | de Hoop et al. | |
| 5,715,213 A | 2/1998 | Allen | |
| 5,717,655 A | 2/1998 | Beasley | |
| 5,719,821 A | 2/1998 | Sallas et al. | |
| 5,721,710 A | 2/1998 | Sallas et al. | |
| 5,790,473 A | 8/1998 | Allen | |
| 5,798,982 A | 8/1998 | He et al. | |
| 5,822,269 A | 10/1998 | Allen | |
| 5,838,634 A | 11/1998 | Jones et al. | |
| 5,852,588 A | 12/1998 | de Hoop et al. | |
| 5,878,372 A | 3/1999 | Tabarovsky et al. | |
| 5,920,828 A | 7/1999 | Norris et al. | |
| 5,924,049 A | 7/1999 | Beasley et al. | |
| 5,999,488 A | 12/1999 | Smith | |
| 5,999,489 A | 12/1999 | Lazaratos | |
| 6,014,342 A | 1/2000 | Lazaratos | |
| 6,021,094 A | 2/2000 | Ober et al. | |
| 6,028,818 A | 2/2000 | Jeffryes | |
| 6,058,073 A | 5/2000 | VerWest | |
| 6,125,330 A | 9/2000 | Robertson et al. | |
| 6,219,621 B1 | 4/2001 | Hornbostel | |
| 6,225,803 B1 | 5/2001 | Chen | |
| 6,311,133 B1 | 10/2001 | Lailly et al. | |
| 6,317,695 B1 | 11/2001 | Zhou et al. | |
| 6,327,537 B1 | 12/2001 | Ikelle | |
| 6,374,201 B1 | 4/2002 | Grizon et al. | |
| 6,381,543 B1 | 4/2002 | Guerillot et al. | |
| 6,388,947 B1 | 5/2002 | Washbourne et al. | |
| 6,480,790 B1 | 11/2002 | Calvert et al. | |
| 6,522,973 B1 | 2/2003 | Tonellot et al. | |
| 6,545,944 B2 | 4/2003 | de Kok | |
| 6,549,854 B1 | 4/2003 | Malinverno et al. | |
| 6,574,564 B2 | 6/2003 | Lailly et al. | |
| 6,593,746 B2 | 7/2003 | Stolarczyk | |
| 6,662,147 B1 | 12/2003 | Fournier et al. | |
| 6,665,615 B2 | 12/2003 | Van Riel et al. | |
| 6,687,619 B2 | 2/2004 | Moerig et al. | |
| 6,687,659 B1 | 2/2004 | Shen | |
| 6,704,245 B2 | 3/2004 | Becquey | |
| 6,714,867 B2 | 3/2004 | Meunier | |
| 6,735,527 B1 | 5/2004 | Levin | |
| 6,754,590 B1 | 6/2004 | Moldoveanu | |
| 6,766,256 B2 | 7/2004 | Jeffryes | |
| 6,826,486 B1 | 11/2004 | Malinverno | |
| 6,836,448 B2 | 12/2004 | Robertsson et al. | |
| 6,842,701 B2 | 1/2005 | Moerig et al. | |
| 6,859,734 B2 | 2/2005 | Bednar | |
| 6,865,487 B2 | 3/2005 | Charron | |
| 6,865,488 B2 | 3/2005 | Moerig et al. | |
| 6,876,928 B2 | 4/2005 | Van Riel et al. | |
| 6,882,938 B2 | 4/2005 | Vaage et al. | |
| 6,882,958 B2 | 4/2005 | Schmidt et al. | |
| 6,901,333 B2 | 5/2005 | Van Riel et al. | |
| 6,903,999 B2 | 6/2005 | Curtis et al. | |
| 6,927,698 B2 | 8/2005 | Stolarczyk | |
| 6,944,546 B2 | 9/2005 | Xiao et al. | |
| 6,947,843 B2 | 9/2005 | Fisher et al. | |
| 6,954,698 B2 * | 10/2005 | Tryggvason | 702/5 |
| 6,954,721 B2 * | 10/2005 | Webber | 702/189 |
| 6,970,397 B2 | 11/2005 | Castagna et al. | |
| 6,977,866 B2 | 12/2005 | Huffman et al. | |
| 6,999,880 B2 | 2/2006 | Lee | |
| 7,046,581 B2 | 5/2006 | Calvert | |
| 7,050,356 B2 | 5/2006 | Jeffryes | |
| 7,069,149 B2 | 6/2006 | Goff et al. | |
| 7,072,767 B2 | 7/2006 | Routh et al. | |
| 7,092,823 B2 | 8/2006 | Lailly et al. | |
| 7,110,900 B2 | 9/2006 | Adler et al. | |
| 7,184,367 B2 | 2/2007 | Yin | |
| 7,230,879 B2 | 6/2007 | Herkenhoff et al. | |
| 7,271,747 B2 | 9/2007 | Baraniuk et al. | |
| 7,330,799 B2 | 2/2008 | Lefebvre et al. | |
| 7,337,069 B2 | 2/2008 | Masson et al. | |
| 7,373,251 B2 | 5/2008 | Hamman et al. | |
| 7,373,252 B2 | 5/2008 | Sherrill et al. | |
| 7,376,046 B2 | 5/2008 | Jeffryes | |
| 7,376,539 B2 | 5/2008 | Lecomte | |
| 7,400,978 B2 | 7/2008 | Langlais et al. | |
| 7,436,734 B2 | 10/2008 | Krohn | |
| 7,480,206 B2 | 1/2009 | Hill | |
| 7,584,056 B2 | 9/2009 | Koren | |
| 7,599,798 B2 | 10/2009 | Beasley et al. | |
| 7,602,670 B2 | 10/2009 | Jeffryes | |
| 7,616,523 B1 | 11/2009 | Tabti et al. | |
| 7,620,534 B2 | 11/2009 | Pita et al. | |
| 7,640,110 B2 * | 12/2009 | Abubakar et al. | 702/2 |
| 7,646,924 B2 | 1/2010 | Donoho | |
| 7,672,194 B2 | 3/2010 | Jeffryes | |
| 7,672,824 B2 | 3/2010 | Dutta et al. | |
| 7,675,815 B2 | 3/2010 | Saenger et al. | |
| 7,679,990 B2 | 3/2010 | Herkenhoff et al. | |
| 7,715,985 B2 | 5/2010 | Van Manen et al. | |
| 7,715,986 B2 | 5/2010 | Nemeth et al. | |
| 7,725,266 B2 | 5/2010 | Sirgue et al. | |
| 7,791,980 B2 | 9/2010 | Robertsson et al. | |
| 7,835,072 B2 | 11/2010 | Izumi | |
| 7,840,625 B2 | 11/2010 | Candes et al. | |
| 7,940,601 B2 | 5/2011 | Ghosh | |
| 7,974,824 B2 * | 7/2011 | Song | 703/10 |
| 8,121,823 B2 | 2/2012 | Krebs et al. | |
| 2002/0099504 A1 | 7/2002 | Cross et al. | |
| 2002/0120429 A1 | 8/2002 | Ortoleva | |
| 2002/0183980 A1 | 12/2002 | Guillaume | |
| 2004/0199330 A1 | 10/2004 | Routh et al. | |
| 2006/0235666 A1 | 10/2006 | Assa et al. | |
| 2007/0036030 A1 | 2/2007 | Baumel et al. | |
| 2007/0038691 A1 | 2/2007 | Candes et al. | |
| 2007/0274155 A1 | 11/2007 | Ikelle | |
| 2008/0175101 A1 | 7/2008 | Saenger et al. | |
| 2008/0279434 A1 * | 11/2008 | Cassill | 382/131 |
| 2008/0306692 A1 | 12/2008 | Singer et al. | |
| 2009/0067041 A1 | 3/2009 | Krauklis et al. | |
| 2009/0070042 A1 | 3/2009 | Birchwood et al. | |
| 2009/0083006 A1 | 3/2009 | Mackie | |
| 2009/0164186 A1 | 6/2009 | Haase et al. | |
| 2009/0164756 A1 | 6/2009 | Dokken et al. | |
| 2009/0187391 A1 | 7/2009 | Wendt et al. | |
| 2009/0248308 A1 | 10/2009 | Luling | |
| 2009/0254320 A1 | 10/2009 | Lovatini et al. | |
| 2009/0259406 A1 | 10/2009 | Khadhraoui et al. | |
| 2010/0008184 A1 | 1/2010 | Hegna et al. | |
| 2010/0018718 A1 | 1/2010 | Krebs et al. | |
| 2010/0039894 A1 | 2/2010 | Abma | |
| 2010/0054082 A1 | 3/2010 | McGarry et al. | |
| 2010/0088035 A1 | 4/2010 | Etgen et al. | |
| 2010/0103772 A1 | 4/2010 | Eick et al. | |
| 2010/0118651 A1 | 5/2010 | Liu et al. | |
| 2010/0142316 A1 | 6/2010 | Keers et al. | |
| 2010/0161233 A1 | 6/2010 | Saenger et al. | |
| 2010/0161234 A1 | 6/2010 | Saenger et al. | |
| 2010/0185422 A1 | 7/2010 | Hoversten | |
| 2010/0208554 A1 | 8/2010 | Chiu et al. | |

(56) References Cited

U.S. PATENT DOCUMENTS

| | | |
|---|---|---|
| 2010/0212909 A1 | 8/2010 | Baumstein et al. |
| 2010/0265797 A1 | 10/2010 | Robertsson et al. |
| 2010/0270026 A1 | 10/2010 | Lazaratos et al. |
| 2010/0286919 A1 | 11/2010 | Lee et al. |
| 2010/0299070 A1 | 11/2010 | Abma |
| 2011/0000678 A1 | 1/2011 | Krebs et al. |
| 2011/0040926 A1 | 2/2011 | Donderici et al. |
| 2011/0051553 A1 | 3/2011 | Scott et al. |
| 2011/0090760 A1 | 4/2011 | Rickett et al. |
| 2011/0131020 A1 | 6/2011 | Meng |
| 2011/0134722 A1 | 6/2011 | Virgilio et al. |
| 2011/0182141 A1 | 7/2011 | Zhamikov et al. |
| 2011/0182144 A1 | 7/2011 | Gray |
| 2011/0191032 A1 | 8/2011 | Moore |
| 2011/0194379 A1 | 8/2011 | Lee et al. |
| 2011/0222370 A1 | 9/2011 | Downton et al. |
| 2011/0227577 A1 | 9/2011 | Zhang et al. |
| 2011/0235464 A1 | 9/2011 | Brittan et al. |
| 2011/0238390 A1 | 9/2011 | Krebs et al. |
| 2011/0246140 A1 | 10/2011 | Abubakar et al. |
| 2011/0267921 A1 | 11/2011 | Mortel et al. |
| 2011/0276320 A1 | 11/2011 | Krebs et al. |
| 2011/0288831 A1 | 11/2011 | Tan et al. |
| 2012/0014215 A1 | 1/2012 | Saenger et al. |
| 2012/0014216 A1 | 1/2012 | Saenger et al. |
| 2012/0051176 A1 | 3/2012 | Liu |
| 2012/0073824 A1 | 3/2012 | Routh |
| 2012/0073825 A1 | 3/2012 | Routh |
| 2012/0082344 A1 | 4/2012 | Donoho |

FOREIGN PATENT DOCUMENTS

| | | |
|---|---|---|
| GB | 2 390 712 | 1/2004 |
| GB | 2 391 665 | 2/2004 |
| WO | WO 2006/037815 | 4/2006 |
| WO | WO 2007/046711 | 4/2007 |
| WO | WO 2008/042081 | 4/2008 |
| WO | WO 2008/123920 | 10/2008 |
| WO | WO 2009/067041 | 5/2009 |
| WO | WO 2009/117174 | 9/2009 |
| WO | WO 2011/040926 | 4/2011 |
| WO | WO 2011/091216 | 7/2011 |
| WO | WO 2011/093945 | 8/2011 |

OTHER PUBLICATIONS

Kim et al, "Efficient Imaging of Crosshole Electromagnetic Data", Lawrence Berkley National Laboratory, Sep. 3, 2002.*

Mufti et al, Finite Difference Depth Migration of Exploration-Scale 3-D Seismic Data, Geophysics, vol. 61, No. 3, May-Jun. 1996.*

U.S. Appl. No. 13/224,005, filed Sep. 1, 2011, Routh et al.

Abt, D.L. et al. (2010), "North American lithospheric discontinuity structured imaged by Ps and Sp receiver functions", *J. Geophys. Res.*, 24 pgs.

Akerberg, P., et al. (2008), "Simultaneous source separation by sparse radon transform," 78th SEG Annual International Meeting, *Expanded Abstracts*, pp. 2801-2805.

Aki, K. et al. (1980), "Quantitative Seismology: Theory and Methods vol. I—Chapter 7—Surface Waves in a Vertically Heterogenous Medium," W.H. Freeman and Co., pp. 259-318.

Aki, K. et al. (1980), "Quantitative Seismology: Theory and Methods Vol. I," W.H. Freeman and Co., p. 173.

Anderson, J.E. et al. (2008), "Sources Near the Free-Surface Boundary: Pitfalls for Elastic Finite-Difference Seismic Simulation and Multi-Grid Waveform Inversion," 70$^{th}$ EAGE Conf. & Exh., 4 pgs.

Baumstein, A. et al. (2009), "Scaling of the Objective Function Gradient for Full Wavefield Inversion," SEG Houston 2009 Int'l. Expo and Annual Meeting, pp. 224-2247.

Beasley, C. (2008), "A new look at marine simultaneous sources," *The Leading Edge* 27(7), pp. 914-917.

Beaty, K.S. et al. (2003), "Repeatability of multimode Rayleigh-wave dispersion studies," *Geophysics* 68(3), pp. 782-790.

Beaty, K.S. et al. (2002), "Simulated annealing inversion of multimode Rayleigh wave dispersion waves for geological structure," *Geophys. J. Int.* 151, pp. 622-631.

Becquey, M. et al. (2002), "Pseudo-Random Coded Simultaneous Vibroseismics," SEG Int'l. Exposition and 72th Annl. Mtg., 4 pgs.

Berkhout, A.J. (1987), "Applied Seismic Wave Theory," Elsevier Science Publishers, p. 142.

Berkhout, A.J. (1992), "Areal shot record technology," *Journal of Seismic Exploration* 1, pp. 251-264.

Berkhout, A.J. (2008), "Changing the mindset in seismic data acquisition," *The Leading Edge* 27(7), pp. 924-938.

Ben-Hadj-Ali, H. et al. (2009), "Three-dimensional frequency-domain full waveform inversion with phase encoding," *SEG Expanded Abstracts*, pp. 2288-2292.

Beylkin, G. (1985), "Imaging of discontinuities in the inverse scattring problem by inversion of a causal generalized Radon transform," *J. Math. Phys.* 26, pp. 99-108.

Bonomi, E. et al. (2006), "Wavefield Migration plus Monte Carlo Imaging of 3D Prestack Seismic Data," *Geophysical Prospecting* 54, pp. 505-514.

Boonyasiriwat, C. et al. (2010), *3D Multisource Full-Waveform using Dynamic Random Phase Encoding*, SEG Denver 2010 Annual Meeting, pp. 1044-1049.

Boonyasiriwat, C. et al. (2010), *3D Multisource Full-Waveform using Dynamic Random Phase Encoding*, SEG Denver 2010 Annual Meeting, pp. 3120-3124.

Bunks, C., et al. (1995), "Multiscale seismic waveform inversion," *Geophysics* 60, pp. 1457-1473.

Burstedde, G. et al. (2009), "Algorithmic strategies for full waveform inversion: 1D experiments," *Geophysics* 74(6), pp. WCC17-WCC46.

Chavent, G. et al. (1999), "An optimal true-amplitude least-squares prestack depth-migration operator," *Geophysics* 64(2), pp. 508-515.

Clapp, R.G. (2009), "Reverse time migration with random boundaries," SEG International Exposition and Meeting, *Expanded Abstracts*, pp. 2809-2813.

Dai, W. et al. (2010), "3D Multi-source Least-squares Reverse Time Migration," SEG Denver 2010 Annual Meeting, pp. 3120-3124.

Delprat-Jannuad, F. et al. (2005), "A fundamental limitation for the reconstruction of impedance profiles from seismic data," *Geophysics* 70(1), pp. R1-R14.

Dickens, T.A. et al. (2011), RTM angle gathers using Poynting vectors, *SEG Expanded Abstracts* 30, pp. 3109-3113.

Dunkin, J.W. et al. (1973), "Effect of Normal Moveout on a Seismic Pluse," *Geophysics* 38(4), pp. 635-642.

Dziewonski A. et al. (1981), "Preliminary Reference Earth Model", *Phys. Earth Planet. Int.* 25(4), pp. 297-356.

Ernst, F.E. et al. (2000), "Tomography of dispersive media," *J. Acoust. Soc. Am* 108(1), pp. 105-116.

Ernst, F.E. et al. (2002), "Removal of scattered guided waves from seismic data," *Geophysics* 67(4), pp. 1240-1248.

Esmersoy, C. (1990), "Inversion of P and SV waves from multicomponent offset vertical seismic profiles", *Geophysics* 55(1), pp. 39-50.

Fallat, M.R. et al. (1999), "Geoacoustic inversion via local, global, and hybrid algorithms," *Journal of the Acoustical Society of America* 105, pp. 3219-3230.

Fichtner, A. et al. (2006), "The adjoint method in seismology I. Theory," *Physics of the Earth and Planetary Interiors* 157, pp. 86-104.

Forbriger, T. (2003), "Inversion of shallow-seismic wavefields: I. Wavefield transformation," *Geophys. J. Int.* 153, pp. 719-734.

Gibson, B. et al. (1984), "Predictive deconvolution and the zero-phase source," *Geophysics* 49(4), pp. 379-397.

Griewank, A. (1992), "Achieving logarithmic growth of temporal and spatial complexity in reverse automatic differentiation," 1 *Optimization Methods and Software*, pp. 35-54.

Griewank, A. (2000), Evaluating Derivatives: Principles and Techniques of Algorithmic Differentiation, Society for Industrial and Applied Mathematics, 49 pgs.

Griewank, A. et al. (2000), "Algorithm 799: An implementation of checkpointing for the reverse or adjoint mode of computational differentiation," 26 ACM Transactions on Mathematical Software, pp. 19-45.

(56) References Cited

OTHER PUBLICATIONS

Griewank, A. et al. (1996), "Algorithm 755: A package for the automatic differentiation of algorithms written in C/C++," ACM Transactions on Mathematical Software 22(2), pp. 131-167.
Haber, E. et al. (2010), "An effective method for parameter estimation with PDE constraints with multiple right hand sides," Preprint—UBC http://www.math.ubc.ca/~haber/pubs/PdeOptStochV5.pdf.
Hampson, D.P. et al. (2005), "Simultaneous inversion of pre-stack seismic data," SEG 75th Annual Int'l. Meeting, Expanded Abstracts, pp. 1633-1637.
Helbig, K. (1994), "Foundations of Anisotropy for Exploration Seismics," Chapter 5, pp. 185-194.
Herrmann, F.J. (2010), "Randomized dimensionality reduction for full-waveform inversion," EAGE abstract G001, EAGE Barcelona meeting, 5 pgs.
Holschneider, J. et al. (2005), "Characterization of dispersive surface waves using continuous wavelet transforms," Geophys. J. Int. 163, pp. 463-478.
Hu, L.Z. et al. (1987), "Wave-field transformations of vertical seismic profiles," Geophysics 52, pp. 307-321.
Huang, Y. et al. (2012), "Multisource least-squares migration of marine streamer and land data with frequency-division encoding," Geophysical Prospecting 60, pp. 663-680.
Igel, H. et al. (1996), "Waveform inversion of marine reflection seismograms for P impedance and Poisson's ratio," Geophys. J. Int. 124, pp. 363-371.
Jing, X. et al. (2000), "Encoding multiple shot gathers in prestack migration," SEG International Exposition and 70th Annual Meeting Expanded Abstracts, pp. 786-789.
Kennett, B.L.N. (1991), "The removal of free surface interactions from three-component seismograms", Geophys. J. Int. 104, pp. 153-163.
Krebs, J.R. (2008), "Fast Full-wavefield seismic inversion using encoded sources," Geophysics 74(6), pp. WCC177-WCC188.
Krohn, C.E. (1984), "Geophone ground coupling," Geophysics 49(6), pp. 722-731.
Kroode, F.T. et al. (2009), "Wave Equation Based Model Building and Imaging in Complex Settings," OTC 20215, 2009 Offshore Technology Conf., Houston, TX, May 4-7, 2009, 8 pgs.
Kulesh, M. et al. (2008), "Modeling of Wave Dispersion Using Continuous Wavelet Transforms II: Wavelet-based Frequency-velocity Analysis," Pure Applied Geophysics 165, pp. 255-270.
Lancaster, S. et al. (2000), "Fast-track 'colored' inversion," $70^{th}$ SEG Ann. Meeting, *Expanded Abstracts*, pp. 1572-1575.
Lazaratos, S. et al. (2009), "Inversion of Pre-migration Spectral Shaping," 2009 SEG Houston Int'l. Expo. & Ann. Meeting, *Expanded Abstracts*, pp. 2383-2387.
Lazaratos, S. (2006), "Spectral Shaping Inversion for Elastic and Rock Property Estimation," *Research Disclosure*, Issue 511, pp. 1453-1459.
Lazaratos, S. et al. (2011), "Improving the convergence rate of full wavefield inversion using spectral shaping," *SEG Expanded Abstracts* 30, pp. 2428-2432.
Lecomte, I. (2008), "Resolution and illumination analyses in PSDM: A ray-based approach," The Leading Edge, pp. 650-663.
Lee, S. et al. (2010), "Subsurface parameter estimation in full wavefield inversion and reverse time migration," SEG Denver 2010 Annual Meeting, pp. 1065-1069.
Liao, Q. et al. (1995), "2.5D full-wavefield viscoacoustic inversion," *Geophysical Prospecting* 43, pp. 1043-1059.
Liu, F. et al. (2007), "Reverse-time migration using one-way wavefield imaging condition," *SEG Expanded Abstracts* 26, pp. 2170-2174.
Liu, F. et al. (2011), "An effective imaging condition for reverse-time migration using wavefield decomposition," *Geophysics* 76, pp. S29-S39.
Malmedy, V. et al. (2009), "Approximating Hessians in unconstrained optimization arising from discretized problems," *Computational Optimization and Applications*, pp. 1-16.
Marcinkovich, C. et al. (2003), "On the implementation of perfectly matched layers in a three-dimensional fourth-order velocity-stress finite difference scheme," *J. of Geophysical Research* 108(B5), 2276.
Martin, G.S. et al. (2006), "Marmousi2: An elastic upgrade for Marmousi," *The Leading Edge*, pp. 156-166.
Moghaddam, P.P. et al. (2010), "Randomized full-waveform inversion: a dimenstionality-reduction approach," $80^{th}$ SEG Ann. Meeting, *Expanded Abstracts*, pp. 977-982.
Mora, P. (1987), "Elastic Wavefield Inversion," PhD Thesis, Stanford University, pp. 22-25.
Mora, P. (1989), "Inversion=migration+tomography," *Geophysics* 64, pp. 888-901.
Nocedal, J. et al. (2006), *"Numerical Optimization, Chapt. 7—Large-Scale Unconstrained Optimization,"* Springer, New York, $2^{nd}$ Edition, pp. 165-176.
Ostmo, S. et al. (2002), "Finite-difference iterative migration by linearized waveform inversion in the frequency domain," SEG Int'l. Expo. & $72^{nd}$ Ann. Meeting, 4 pgs.
Pica, A. et al. (2005), "3D Surface-Related Multiple Modeling, Principles and Results," 2005 SEG Ann. Meeting, *SEG Expanded Abstracts* 24, pp. 2080-2083.
Pratt, R.G. (1999), "Seismic waveform inversion in the frequency domain, Part 1: Theory and verification in a physical scale model," *Geophysics* 64, pp. 888-901.
Routh, P. et al. (2011), "Encoded Simultaneous Source Full-Wavefield Inversion for Spectrally-Shaped Marine Streamer Data," SEG San Antonio 2011 Ann. Meeting, pp. 2433-2438.
Sears, T.J. et al. (2008), "Elastic full waveform inversion of multi-component OBC seismic data," *Geophysical Prospecting* 56, pp. 843-862.
Sheen, D-H. et al. (2006), "Time domain Gauss-Newton seismic waveform inversion in elastic media," Geophysics J. Int. 167, pp. 1373-1384.
Shen, P. et al. (2003), "Differential semblance velocity analysis by wave-equation migration," $73^{rd}$ Ann. Meeting of Society of Exploration Geophysicists, 4 pgs.
Shih, R-C. et al. (1996), "Iterative pre-stack depth migration with velocity analysis," *Terrestrial, Atmospheric & Oceanic Sciences* 7(2), pp. 149-158.
Simard, P.Y. et al. (1990), "Vector Field Restoration by the Method of Convex Projections," *Computer Vision, Graphics and Image Processing* 52, pp. 360-385.
Tang, Y. (2008), "Wave-equation Hessian by phase encoding," *SEG Expanded Abstracts* 27, pp. 2201-2205.
Tang, Y. (2009), "Target-oriented wave-equation least-squares migration/inversion with phase-encoded Hessian," *Geophysics* 74, pp. WCA95-WCA107.
Tang, Y. et al. (2010), "Preconditioning full waveform inversion with phase-encoded Hessian," *SEG Expanded Abstracts* 29, pp. 1034-1037.
Tarantola, A. (1984), "Inversion of seismic reflection data in the acoustic approximation," *Geophysics* 49, pp. 1259-1266.
Tarantola, A. (1986), "A strategy for nonlinear elastic inversion of seismic reflection data," *Geophysics* 51(10), pp. 1893-1903.
Tarantola, A. (2005), "Inverse Problem Theory and Methods for Model Parameter Estimation," *SIAM*, pp. 79.
Tsvankin, I. (2001), "Seismic Signatures and Analysis of Reflection Data in Anisotropic Media," Elsevier Science, p. 8.
van Manen, D.J. (2005), "Making wave by time reversal," SEG International Exposition and $75^{th}$ Annual Meeting, *Expanded Abstracts*, pp. 1763-1766.
van Groenestijn, G.J.A. et al. (2009), "Estimating primaries by sparse inversion and application to near-offset reconstruction," *Geophyhsics* 74(3), pp. A23-A28.
Verschuur, D.J. et al. (1992), "Adaptive surface-related multiple elimination," *Geophysics* 57(9), pp. 1166-1177.
Verschuur, D.J. (1989), "Wavelet Estimation by Prestack Multiple Elimination," *SEG Expanded Abstracts* 8, pp. 1129-1132.
Wang, Y. (2007), "Multiple prediction through inversion: Theoretical advancements and real data application," Geophysics 72(2), pp. V33-V39.

(56) References Cited

OTHER PUBLICATIONS

Wang, K. et al. (2009), "Simultaneous full-waveform inversion for source wavelet and earth model," SEG Int'l. Expo. & Ann. Meeting, Expanded Abstracts, pp. 2537-2541.

Wu R-S. et al. (2006), "Directional illumination analysis using beamlet decomposition and propagation," *Geophysics* 71(4), pp. S147-S159.

Xie, X. et al. (2002), "Extracting angle domain information from migrated wavefield," *SEG Expanded Abstracts* 21, pp. 1360-1363.

Xie, X.-B. et al. (2006), "Wave-equation-based seismic illumination analysis," *Geophysics* 71(5), pp. S169-S177.

Yoon, K. et al. (2004), "Challenges in reverse-time migration," *SEG Expanded Abstracts* 23, pp. 1057-1060.

Young, J. et al. (2011), "An application of random projection to parameter estimation in partial differential equations," SIAM, 20 pgs.

Biondi, B. (1992), "Velocity estimation by beam stack," *Geophysics* 57(8), pp. 1034-1104.

Choi, Y. et al. (2011), "Application of encoded multisource waveform inversion to marine-streamer acquisition based on the global correlation," 73$^{rd}$ EAGE Conference, *Abstract*, pp. F026.

Choi, Y et al. (2012), "Application of multi-source waveform inversion to marine stream data using the global correlation norm," *Geophysical Prospecting* 60, pp. 748-758.

Ikelle, L.T. (2007), "Coding and decoding: Seismic data modeling, acquisition, and processing," 77th Annual Int'l. Meeting, SEG Expanded Abstracts, pp. 66-70.

Jackson, D.R. et al. (1991), "Phase conjugation in underwater acoustics," *J. Acoust. Soc. Am.* 89(1), pp. 171-181.

Levanon, N. (1988), "Radar Principles," Chpt. 1, John Whiley & Sons, New York, pp. 1-18.

Maharramov, M. et al. (2007), "Localized image-difference wave-equation tomography," SEG Annual Meeting, *Expanded Abstracts*, pp. 3009-3013.

Meier, M.A. et al. (2009), "Converted wave resolution," Geophysics, 74(2):doi:10.1190/1.3074303, pp. Q1-Q16.

Mora, P. (1987), "Nonlinear two-dimensional elastic inversion of multi-offset seismic data," *Geophysics* 52, pp. 1211-1228.

Nazarian, S. et al. (1983), "Use of spectral analysis of surface waves method for determination of moduli and thickness of pavement systems," *Transport Res. Record* 930, pp. 38-45.

Neelamani, R., (2008), "Simultaneous sourcing without compromise," 70th Annual Int'l Conf. and Exh., EAGE, 5 pgs.

Neelamani, R. (2009), "Efficient seismic forward modeling using simultaneous sources and sparsity," *SEG Expanded Abstracts*, pp. 2107-2111.

Plessix, R.E. et al. (2004), "Frequency-domain finite-difference amplitude preserving migration." *Geophys. J. Int.* 157, pp. 975-987.

Park, C.B. et al. (1999), "Multichannel analysis of surface waves," *Geophysics* 64(3), pp. 800-808.

Park, C.B. et al. (2007), "Multichannel analysis of surface waves (MASW)—active and passive methods," *The Leading Edge*, pp. 60-64.

Porter, R.P. (1989), "Generalized holography with application to inverse scattering and inverse source problems," In E. Wolf, editor, Progress in Optics XXVII, Elsevier, pp. 317-397.

Pratt, R.G. et al. (1998), "Gauss-Newton and full Newton methods in frequency-space seismic waveform inversion," *Geophys. J. Int.* 133, pp. 341-362.

Rayleigh, J.W.S. (1899), "On the transmission of light through an atmosphere containing small particles in suspension, and on the origin of the blue of the sky," Phil. Mag. 47, pp. 375-384.

Romero, L.A. et al. (2000), Phase encoding of shot records in prestack migration, *Geophysics* 65, pp. 426-436.

Ryden, N. et al. (2006), "Fast simulated annealing inversion of surface waves on pavement using phase-velocity spectra," *Geophysics* 71(4), pp. R49-R58.

Schuster, G.T. et al. (2010), "Theory of Multisource Crosstalk Reduction by Phase-Encoded Statics," SEG Denver 2010 Ann. Meeting, pp. 3110-3114.

Sheng, J. et al. (2006), "Early arrival waveform tomography on near-surface refraction data," *Geophysics* 71, pp. U47-U57.

Sheriff, R.E. et al. (1982), "*Exploration Seismology*", pp. 134-135.

Shin, C. et al. (2001), "Waveform inversion using a logarithmic wavefield," *Geophysics* 49, pp. 592-606.

Sirgue, L. (2004), "Efficient waveform inversion and imaging: A strategy for selecting temporal frequencies," *Geophysics* 69, pp. 231-248.

Soubaras, R. et al. (2007), "Velocity model building by semblance maximization of modulated-shot gathers," *Geophysics* 72(5), pp. U67-U73.

Spitz, S. (2008), "Simultaneous source separation: a prediction-subtraction approach," 78th Annual Int'l. Meeting, *SEG Expanded Abstracts*, pp. 2811-2815.

Stefani, J. (2007), "Acquisition using simultaneous sources," 69th Annual Conf. and Exh., *EAGE Extended Abstracts*, 5 pgs.

Symes, W.W. (2007), "Reverse time migration with optimal checkpointing," *Geophysics* 72(5), pp. P.SM213-P.SM221.

Tarantola, A. (1988), "Theoretical background for the inversion of seismic waveforms, including elasticity and attenuation," *Pure and Applied Geophysics* 128, pp. 365-399.

Trantham, E.C. (1994), "Controlled-phase acquisition and processing," *SEG Expanded Abstracts* 13, pp. 890-894.

Verschuur, D.J. (2009), Target-oriented, least-squares imaging of blended data, 79th Annual Int'l. Meeting, *SEG Expanded Abstracts*, pp. 2889-2893.

Vigh, D. et al. (2008), "3D prestack plane-wave, full-waveform inversion," *Geophysics* 73(5), pp. VE135-VE144.

Weglein, A.B. (2003), "Inverse scattering series and seismic exploration," *Inverse Problems* 19, pp. R27-R83.

Xia, J. et al. (2004), "Utilization of high-frequency Rayleigh waves in near-surface geophysics," *The Leading Edge*, pp. 753-759.

Zhang, Y. (2005), "Delayed-shot 3D depth migration," *Geophysics* 70, pp. E21-E28.

Ziolkowski, A. (1991), "Why don't we measure seismic signatures?," *Geophysics* 56(2), pp. 190-201.

\* cited by examiner

ARTIFACT REDUCTION IN ITERATIVE INVERSION OF GEOPHYSICAL DATA

CROSS-REFERENCE TO RELATED APPLICATION

This application is a continuation of U.S. patent application Ser. No. 13/045,215, filed Mar. 10, 2011, entitled ARTIFACT REDUCTION IN ITERATIVE INVERSION OF GEOPHYSICAL DATA and claims the benefit of U.S. Provisional Patent Application 61/332,463, filed May 7, 2010, entitled ARTIFACT REDUCTION IN ITERATIVE INVERSION OF GEOPHYSICAL DATA. The entirety of U.S. patent application Ser. No. 13/045,215 and U.S. Provisional Patent Application 61/332,463 are hereby incorporated by reference herein.

FIELD OF THE INVENTION

The invention relates generally to the field of geophysical prospecting, and more particularly to geophysical data processing. Specifically, the invention pertains to reducing artifacts in iterative inversion of data resulting from approximations made in the inversion.

BACKGROUND OF THE INVENTION

Geophysical inversion [1,2] attempts to find a model of subsurface properties that optimally explains observed data and satisfies geological and geophysical constraints. There are a large number of well known methods of geophysical inversion. These well known methods fall into one of two categories, iterative inversion and non-iterative inversion. The following are definitions of what is commonly meant by each of the two categories:
  Non-iterative inversion—inversion that is accomplished by assuming some simple background model and updating the model based on the input data. This method does not use the updated model as input to another step of inversion. For the case of seismic data these methods are commonly referred to as imaging, migration, diffraction tomography or Born inversion.
  Iterative inversion—inversion involving repetitious improvement of the subsurface properties model such that a model is found that satisfactorily explains the observed data. If the inversion converges, then the final model will better explain the observed data and will more closely approximate the actual subsurface properties. Iterative inversion usually produces a more accurate model than non-iterative inversion, but is much more expensive to compute.

Two iterative inversion methods commonly employed in geophysics are cost function optimization and series methods. Cost function optimization involves iterative minimization or maximization of the value, with respect to the model M, of a cost function S(M) which is a measure of the misfit between the calculated and observed data (this is also sometimes referred to as the objective function), where the calculated data is simulated with a computer using the current geophysical properties model and the physics governing propagation of the source signal in a medium represented by a given geophysical properties model. The simulation computations may be done by any of several numerical methods including but not limited to finite difference, finite element or ray tracing. Series methods involve inversion by iterative series solution of the scattering equation (Weglein [3]). The solution is written in series form, where each term in the series corresponds to higher orders of scattering. Iterations in this case correspond to adding a higher order term in the series to the solution.

Cost function optimization methods are either local or global [4]. Global methods simply involve computing the cost function S(M) for a population of models $\{M_1, M_2, M_3, \ldots\}$ and selecting a set of one or more models from that population that approximately minimize S(M). If further improvement is desired this new selected set of models can then be used as a basis to generate a new population of models that can be again tested relative to the cost function S(M). For global methods each model in the test population can be considered to be an iteration, or at a higher level each set of populations tested can be considered an iteration. Well known global inversion methods include Monte Carlo, simulated annealing, genetic and evolution algorithms.

Local cost function optimization involves:
  1. selecting a starting model,
  2. computing the gradient of the cost function S(M) with respect to the parameters that describe the model,
  3. searching for an updated model that is a perturbation of the starting model in the gradient direction that better explains the observed data.

This procedure is iterated by using the new updated model as the starting model for another gradient search. The process continues until an updated model is found which satisfactorily explains the observed data. Commonly used local cost function inversion methods include gradient search, conjugate gradients and Newton's method.

As discussed above, iterative inversion is preferred over non-iterative inversion, because it yields more accurate subsurface parameter models. Unfortunately, iterative inversion is so computationally expensive that it is impractical to apply it to many problems of interest. This high computational expense is the result of the fact that all inversion techniques require many compute intensive forward and/or reverse simulations. Forward simulation means computation of the data forward in time, and reverse simulation means computation of the data backward in time.

Due to its high computational cost, iterative inversion often requires application of some type of approximation that speeds up the computation. Unfortunately, these approximations usually result in errors in the final inverted model which can be viewed as artifacts of the approximations employed in the inversion.

What is needed is a general method of iteratively inverting data that allows for the application of approximations without generating artifacts in the resulting inverted model. The present invention satisfies this need.

SUMMARY OF THE INVENTION

A physical properties model gives one or more subsurface properties as a function of location in a region. Seismic wave velocity is one such physical property, but so are (for example) density, p-wave velocity, shear wave velocity, several anisotropy parameters, attenuation (q) parameters, porosity, permeability, and resistivity. The invention is a method for reducing artifacts in a subsurface physical property model caused by an approximation, other than source encoding, in an iterative, computerized geophysical data inversion process, said method comprising varying the approximation as the iterations progress. In one particular embodiment, the invention is a computer-implemented method for inversion of measured geophysical data to determine a physical properties model for a subsurface region, comprising:

(a) assuming a physical properties model of the subsurface region, said model providing values of at least one physical property at locations throughout the subsurface region;

(b) selecting an iterative data inversion process having a step wherein a calculation is made of an update to the physical properties model that makes it more consistent with the measured geophysical data;

(c) making in said calculation an approximation that either speeds up the selected iterative data inversion process other than by source encoding, or that works an accuracy tradeoff;

(d) executing, using the computer, one cycle of the selected iterative data inversion process with said approximation and using the physical properties model;

(e) executing, using the computer, a next iterative inversion cycle, wherein a selection is made to either change some aspect of the approximation or not to change it;

(f) repeating (e) as necessary, changing the approximation in some or all of the iteration cycles, until a final iteration wherein a selected convergence criterion is met or another stopping condition is reached; and (g) downloading the updated physical properties model from the final iteration or saving it to computer storage.

In some embodiments of the invention, one or more artifact types are identified in inversion results as being caused by the approximation, and the aspect of the approximation that is changed in some or all iteration cycles is selected for having an effect on artifacts of the one or more identified artifact types. The effect on artifacts may be such that artifacts from one approximation do not add constructively with artifacts from another iteration cycle that uses an approximation with a changed aspect.

BRIEF DESCRIPTION OF THE DRAWINGS

The present invention and its advantages will be better understood by referring to the following detailed description and the attached drawings in which:

FIG. 3 shows the seismic velocity model from which seismic data were computed for the example;

FIG. 4 shows inversion of data from the seismic velocity model in FIG. 3 using the inversion method summarized in FIG. 2;

FIG. 5 shows inversion of data from the seismic velocity model in FIG. 3 using the inversion method summarized in FIG. 2 without the step in which the code used to encode the sources is changed between iterations;

FIG. 7 is the seismic velocity model from which seismic data were computed for the example;

FIG. 8 shows an inversion of data from the seismic velocity model in FIG. 7 using the inversion method summarized in FIG. 6;

FIG. 9 is an inversion of data from the seismic velocity model in FIG. 7 using the inversion method summarized in FIG. 6 without the step in which the depth of the artificial reflection generator is changed between iterations;

FIG. 11 shows the seismic velocity model from which seismic data were computed for the example;

FIG. 12 shows an inversion of data from the seismic velocity model in FIG. 11 using the inversion method summarized in FIG. 10; and FIG. 13 shows an inversion of data from the seismic velocity model in FIG. 11 using the inversion method summarized in FIG. 10 without the step in which the subset of measured data is changed randomly between iterations.

Due to patent constraints, FIGS. 3-5, 7-9, and 11-13 are gray-scale conversions of color displays.

Figure 1:
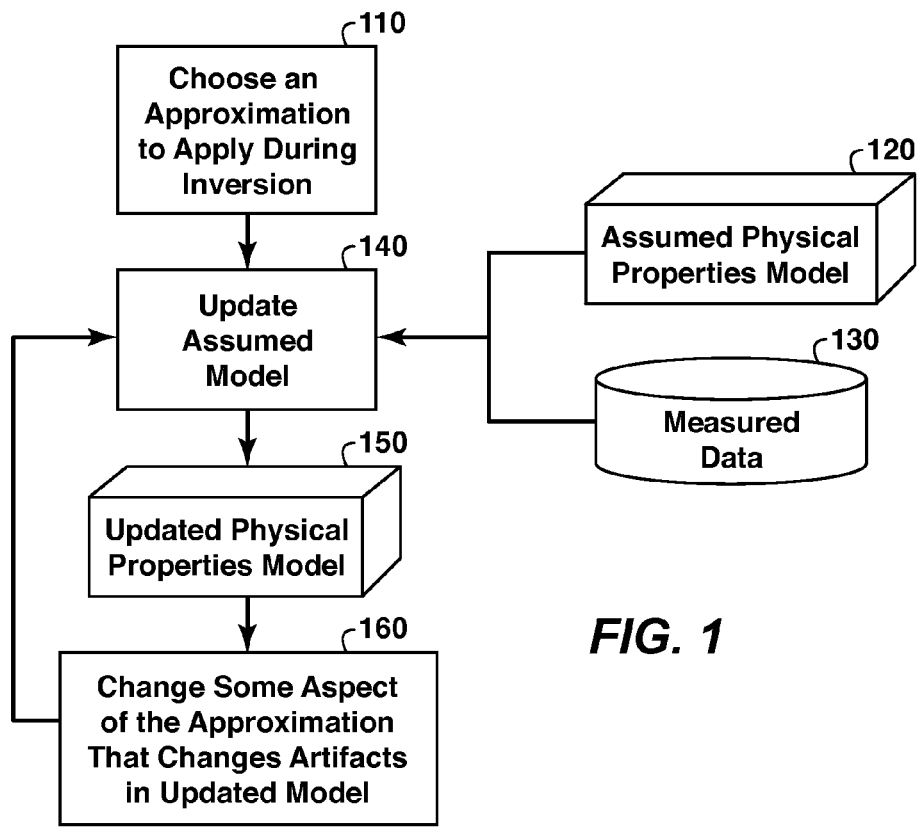
FIG. 1 is a flow chart showing basic steps in a general method disclosed herein.

The invention will be described in connection with its preferred embodiments. However, to the extent that the following detailed description is specific to a particular embodiment or a particular use of the invention, this is intended to be illustrative only, and is not to be construed as limiting the scope of the invention. On the contrary, it is intended to cover all alternatives, modifications and equivalents that may be included within the scope of the invention, as defined by the appended claims.

DETAILED DESCRIPTION OF PREFERRED EMBODIMENTS

The present invention is a method for reducing artifacts caused by the application of approximations during iterative inversion of geophysical data. Geophysical inversion attempts to find a model of subsurface properties that optimally explains observed geophysical data. The example of seismic data is used throughout to illustrate the inventive method, but the method may be advantageously applied to any method of geophysical prospecting and any type of geophysical data. The data inversion is most accurately performed using iterative methods. Unfortunately iterative inversion is often prohibitively expensive computationally. The majority of compute time in iterative inversion is spent performing expensive forward and/or reverse simulations of the geophysical data (here forward means forward in time and reverse means backward in time). The high cost of these simulations is partly due to the fact that each geophysical source in the input data must be computed in a separate computer run of the simulation software. Thus, the cost of simulation is proportional to the number of sources in the geophysical data, typically on the order of 1,000 to 10,000 sources for a geophysical survey. In typical practice, approximations are applied during the inversion to reduce the cost of inversion. These approximations result in errors, or artifacts, in the inverted model. This invention mitigates these artifacts by changing some aspect of the approximation between iterations of inversion so that the artifact during one iteration does not add constructively with the artifact in other iterations. Therefore the artifact is reduced in the inverted model.

Some common approximations made during iterative inversion that result in artifacts include:
1. Processing applied to the measured data
2. Inaccurate boundary conditions in the simulation
3. Approximations in the simulation (e.g. low order approximations of derivatives used in the simulator or the size of the grid cells used in the calculation)

4. Approximations in the parameterization of the model (e.g. use of a spatial grid of parameters that is too coarse to accurately represent variations in the model).

Two iterative inversion methods commonly employed in geophysics are cost function optimization and series methods. The present invention can be applied to both of these methods. A summary of each of these methods follows next.

Iterative Cost Function Optimization

Cost function optimization is performed by minimizing the value, with respect to a subsurface model M, of a cost function S(M) (sometimes referred to as an objective function), which is a measure of misfit between the observed (measured) geophysical data and corresponding data calculated by simulation of the assumed model. A simple cost function S often used in geophysical inversion is:

$$S(M) = \sum_{g=1}^{N_g} \sum_{r=1}^{N_r} \sum_{t=1}^{N_t} |\psi_{calc}(M, g, r, t, w_g) - \psi_{obs}(g, r, t, w_g)|^N \quad (1)$$

where

N=norm for cost function (typically the least squares or L2-Norm is used in which case N=2),
M=subsurface model,
g=gather index (for point source data this would correspond to the individual sources),
$N_g$=number of gathers,
r=receiver index within gather,
$N_r$=number of receivers in a gather,
t=time sample index within a data record,
$N_t$=number of time samples,
$\psi_{calc}$=calculated geophysical data from the model M,
$\psi_{obs}$=measured geophysical data, and
$w_g$=source signature for gather g, i.e. source signal without earth filtering effects.

The gathers in Equation 1 can be any type of gather that can be simulated in one run of a forward modeling program. For seismic data, the gathers correspond to a seismic shot, although the shots can be more general than point sources [5]. For point sources, the gather index g corresponds to the location of individual point sources. For plane wave sources, g would correspond to different plane wave propagation directions. This generalized source data, $\psi_{obs}$, can either be acquired in the field or can be synthesized from data acquired using point sources. The calculated data $\psi_{calc}$ on the other hand can usually be computed directly by using a generalized source function when forward modeling (e.g. for seismic data, forward modeling typically means solution of the anisotropic visco-elastic wave propagation equation or some approximation thereof). For many types of forward modeling, including finite difference modeling, the computation time needed for a generalized source is roughly equal to the computation time needed for a point source. The model M is a model of one or more physical properties of the subsurface region. Seismic wave velocity is one such physical property, but so are (for example) p-wave velocity, shear wave velocity, several anisotropy parameters, attenuation (q) parameters, porosity, and permeability. The model M might represent a single physical property or it might contain many different parameters depending upon the level of sophistication of the inversion. Typically, a subsurface region is subdivided into discrete cells, each cell being characterized by a single value of each parameter.

One major problem with iterative inversion is that computing $\psi_{calc}$ takes a large amount of computer time, and therefore computation of the cost function, S, is very time consuming. Furthermore, in a typical inversion project this cost function must be computed for many different models M.

Iterative Series Inversion

Besides cost function optimization, geophysical inversion can also be implemented using iterative series methods. A common method for doing this is to iterate the Lippmann-Schwinger equation [3]. The Lippmann-Schwinger equation describes scattering of waves in a medium represented by a physical properties model of interest as a perturbation of a simpler model. The equation is the basis for a series expansion that is used to determine scattering of waves from the model of interest, with the advantage that the series only requires calculations to be performed in the simpler model. This series can also be inverted to form an iterative series that allows the determination of the model of interest, from the measured data and again only requiring calculations to be performed in the simpler model. The Lippmann-Schwinger equation is a general formalism that can be applied to all types of geophysical data and models, including seismic waves. This method begins with the two equations:

$$LG = -I \quad (2)$$

$$L_0 G_0 = -I \quad (3)$$

where L, $L_0$ are the actual and reference differential operators, G and $G_0$ are the actual and reference Green's operators respectively and I is the unit operator. Note that G is the measured point source data, and $G_0$ is the simulated point source data from the initial model. The Lippmann-Schwinger equation for scattering theory is:

$$G = G_0 + G_0 V G \quad (4)$$

where $V = L - L_0$ from which the difference between the true and initial models can be extracted.

Equation 4 is solved iteratively for V by first expanding it in a series (assuming $G = G_0$ for the first approximation of G and so forth) to get:

$$G = G_0 + G_0 V G_0 + G_0 V G_0 V G_0 + \ldots \quad (5)$$

Then V is expanded as a series:

$$V = V^{(1)} + V^{(2)} + V^{(3)} + \ldots \quad (6)$$

where $V^{(n)}$ is the portion of V that is $n^{th}$ order in the residual of the data (here the residual of the data is $G - G_0$ measured at the surface). Substituting Equation 6 into Equation 5 and collecting terms of the same order yields the following set of equations for the first 3 orders:

$$G - G_0 = G_0 V^{(1)} G_0 \quad (7)$$

$$0 = G_0 V^{(2)} G_0 + G_0 V^{(1)} G_0 V^{(1)} G_0 \quad (8)$$

$$0 = G_0 V^{(3)} G_0 + G_0 V^{(1)} G_0 V^{(2)} G_0 + G_0 V^{(2)} G_0 V^{(1)} G_0 + G_0 V^{(1)} G_0 V^{(1)} G_0 V^{(1)} G_0 \quad (9)$$

and similarly for higher orders in V. These equations may be solved iteratively by first solving Equation 7 for $V^{(1)}$ by inverting $G_0$ on both sides of $V^{(1)}$ to yield:

$$V^{(1)} = G_0^{-1} (G - G_0) G_0^{-1} \quad (10)$$

$V^{(1)}$ from Equation 10 is then substituted into Equation 8 and this equation is solved for $V^{(2)}$ to yield:

$$V^{(2)} = -G_0^{-1} G_0 V^{(1)} G_0 V^{(1)} G_0 G_0^{-1} \quad (11)$$

and so forth for higher orders of V.

Equation 10 involves a sum over sources and frequency which can be written out explicitly as:

$$V^{(1)} = \sum_{\omega} \sum_{s} G_0^{-1}(G_s - G_{0s})G_{0s}^{-1} \quad (12)$$

where $G_s$ is the measured data for source s, $G_{0s}$ is the simulated data through the reference model for source s and $G_{0s}^{-1}$ can be interpreted as the downward extrapolated source signature from source s. Equation 10 when implemented in the frequency domain can be interpreted as follows: (1) Downward extrapolate through the reference model the source signature for each source (the $G_{0s}^{-1}$ term), (2) For each source, downward extrapolate the receivers of the residual data through the reference model (the $G_0^{-1}(G_s-G_{0s})$ term), (3) multiply these two fields then sum over all sources and frequencies. The downward extrapolations in this recipe can be carried out using geophysical simulation software, for example using finite differences.

Example Embodiment

The flowchart of FIG. 1 shows basic steps in one embodiment of the present inventive method. In step 110, an approximation is selected that will improve some aspect of the inversion process. The improvement may be in the form of a speedup rather than increased accuracy. Examples of such approximations include use of an approximate objective function or use of an approximation in the simulation software. These approximations will often be chosen to reduce the computational cost of inversion. However, rather than a computational speed-up, the improvement may instead work an accuracy tradeoff, i.e. accept more inaccuracy in one aspect of the computation in return for more accuracy in some other aspect. In step 140, an update to an assumed physical properties model 120 is generated based on the measured data 130. In step 140 the approximation chosen in 110 is used to perform the update computations. Using iterative local cost function optimization as an example of iterative inversion, the "update computations" as that term is used herein include, without limitation, computing the objective (cost) function, the objective function gradient, and all forward modeling required to accomplish the preceding. Step 140 produces an updated physical properties model 150, which should be closer to the actual subsurface properties than were those of the assumed physical properties model 120. Conventionally this updated physical properties model 150 would be further improved by feeding it and the measured data 130 back into the update method in step 140 to produce a further improved physical properties model. This conventional iterative inversion method has the disadvantage that any artifacts in the inversion that result from the approximation chosen in step 110 will likely reinforce constructively in the inversion and contaminate the final inverted result.

Rather than directly returning to step 140, the present inventive method interposes step 160 in which some aspect of the approximation chosen in step 110 is changed in a manner such that the artifact caused by the approximation will change and therefore not be reinforced by the iterations of step 140. By this means the artifact resulting from the approximation chosen in step 110 will be mitigated.

Examples of Approximations and Corresponding Artifacts

The following table contains examples of step 110, i.e. of approximations that might advantageously be used in data inversion, and that are suitable (step 160) for application of the present invention. The first column of the table lists approximations that could be used with this invention. The second column lists the artifact associated with each approximation. The last column lists a feature of the approximation that could be varied between iterations to cause a change in the artifact between iterations that will cause it to add incoherently to the final inverted model and thus be mitigated.

| Approximation | Artifact | Features to vary |
|---|---|---|
| Encoded simultaneous source seismic data [6] | Cross-talk noise between the encoded sources | Vary the encoding of the sources [ref. 6, claim 3] |
| Use of a subset of measured data | Footprints of source position in the inverted models caused by source positions | Vary randomly the subset of measured data |
| Imperfect absorbing boundary condition in the simulator | Inaccuracy at the edges of the inverted models caused by artificial reflections from the edges | Vary the thickness of the absorbing boundary layer |
| Use of reflecting boundaries in the simulator | Inaccuracy at the edges of the inverted models caused by artificial reflections from the edges | Vary the reflecting boundary condition type (e.g. vary between Dirchlet or Neumann boundary conditions) |
| Use of random boundary conditions in the simulator [7] | Inaccuracy at the edges of the inverted models caused by artificial reflections from the edges | Vary the distribution of the random boundary |
| Spatial variation of size of grid cells in a finite difference simulator | Errors at the boundaries between changes in the grid cell size caused by artificial reflections from those boundaries | Vary the location of the boundaries separating regions with different grid cell sizes |
| Spatial variation of the accuracy of the simulation operator | Errors at the boundaries between changes in the simulator's operator accuracy caused by artificial reflections from those boundaries | Vary the location of the boundaries separating regions with different operator accuracies |
| Use of a grid cell size in | Spatial discretization | Vary the grid cell size or |

-continued

| Approximation | Artifact | Features to vary |
|---|---|---|
| the simulation that is too coarse to accurately represent variations in the model | errors | the origin of the grid |
| Use of a large time step in a time domain simulator | Discretization errors | Vary the time step interval |

The above list is not exhaustive. The list includes examples only of approximations that reduce computation time. Sometimes it is advantageous to trade inaccuracy in one area to gain more accuracy in another. An example of such an accuracy tradeoff type of approximation is to use less accurate absorbing boundary conditions in the forward modeling in order to make the gradient computations more accurate. Absorbing boundary conditions are needed to solve the differential equation(s) governing the wave propagation, e.g. the anisotropic visco-elastic wave propagation equation (or some approximation thereof) in the case of seismic data, or Maxwell's equations in the case of electromagnetic data. In general, an accuracy tradeoff involves sacrificing accuracy in one aspect of the method in return for increased accuracy in another aspect.

Test Example 1

Encoded Objective Function

Figure 2:
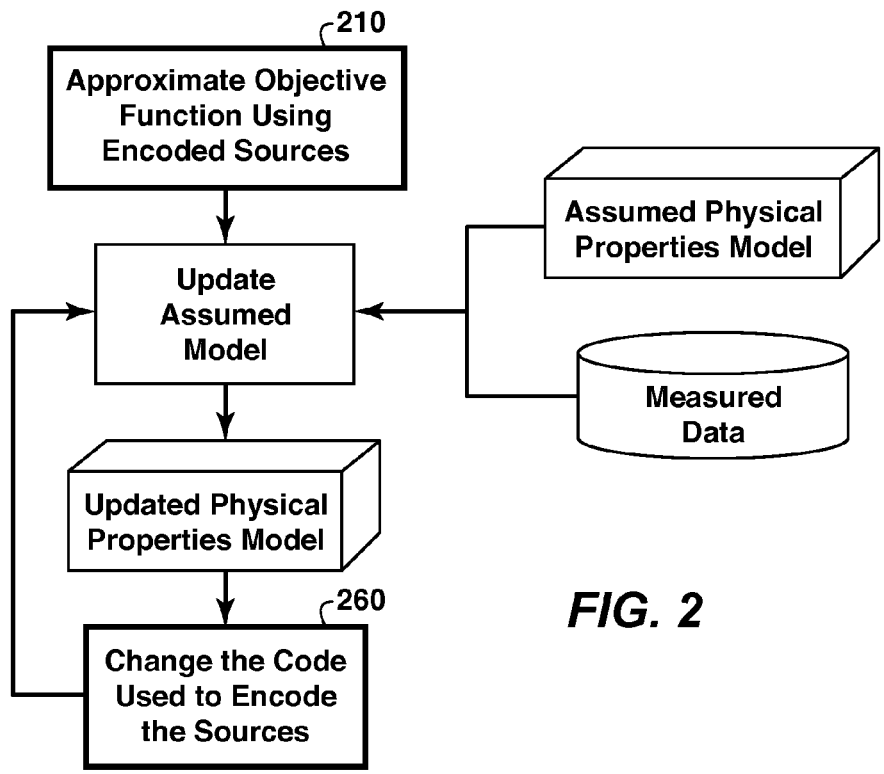
FIG. 2 is a flow chart showing basic steps in a particular embodiment of the method of FIG. 1 wherein the objective function is approximated by encoding and summing the sources.

FIGS. 2-5 represent a synthetic example of performing inversion using an approximation to the objective function in which the seismic sources in the measured data are encoded then summed; see U.S. Application Publication No. 2010-0018718 by Jerome Krebs et al. This approximation speeds up the inversion, because the encoded objective function can be evaluated using one run of the simulation software rather than running it once for each source as is the case for conventional inversion. FIG. 2 is a self-explanatory flow chart that focuses FIG. 1 on this particular embodiment, with step 210 showing the encoding approximation.

Figure 3:
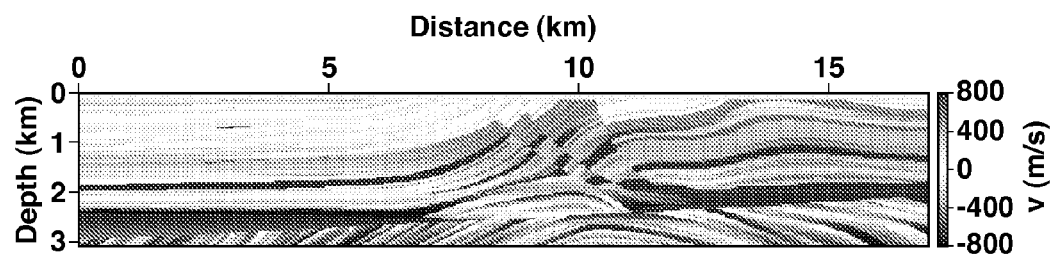
FIGS. 3-5 pertain to an example application of the invention embodiment of FIG. 2.
Figure 4:
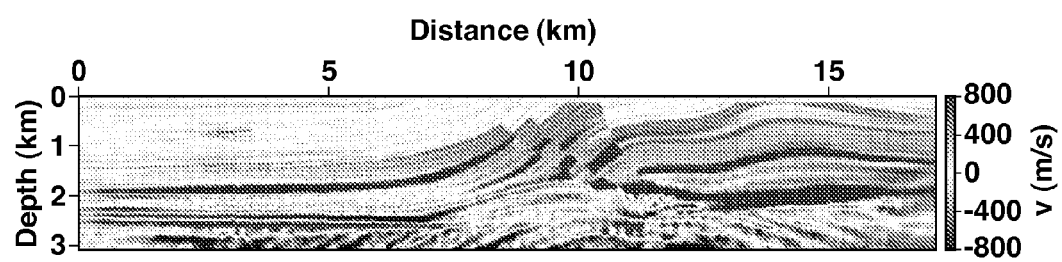

The geophysical properties model in this example is just a model of the acoustic wave velocity. FIG. 3 shows the base velocity model, i.e., the "unknown" model that will be inverted for and which was used to generate the data to be inverted). for this example. The shading indicates the velocity at each depth and lateral location, as indicated by the "color" bar to the right. FIG. 4 shows the inversion resulting from application of this invention as summarized by the flow chart in FIG. 2. In this example the sources are encoded by randomly multiplying them by either plus or minus one. The encoding of the sources is changed, in step 260, by changing the random number seed used to generate the codes used to encode the sources. Note the good match to the base model shown in FIG. 3.

Figure 5:
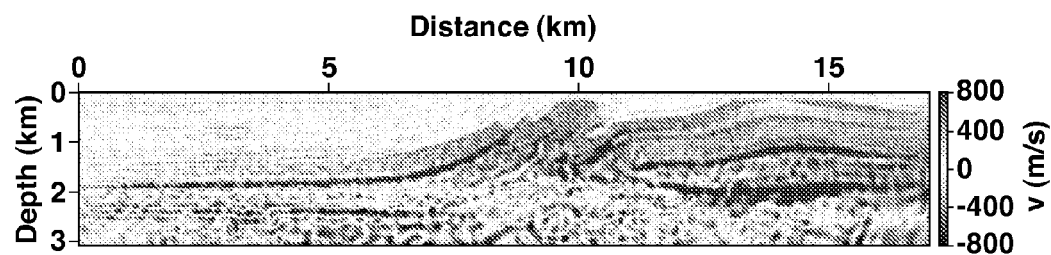

FIG. 5 shows the result of applying the inversion method outlined in the flowchart in FIG. 2, but eliminating the inventive feature of step 260. Note the inversion in FIG. 5 is dominated by crosstalk noise (the speckled appearance of the inversion), whereas this crosstalk noise artifact is largely invisible in the inversion resulting from the present invention (FIG. 4).

Encoding of simultaneous sources was previously disclosed (and claimed) in U.S. Application Publication No. 2010-0018718 by Jerome Krebs et al. along with the technique of varying the encoding from one iteration to the next; see paragraph 62 and claim 3 in that patent publication. However, U.S. Application Publication No. 2010-0018718 by Jerome Krebs et al. neither appreciates nor discloses that the encoding invention is a specific example of the generic invention disclosed herein.

Test Example 2

Approximation that Generates an Artificial Reflection

FIGS. 6-9 illustrate a synthetic example of performing inversion using an approximation to the simulator that generates an artificial reflection. An example of such an approximation is using a finite difference simulator such that the size of the cells in the grid are changed with depth from the surface. This approximation speeds up the inversion, because the grid in the simulator could be adjusted to optimize it in a depth varying manner. Typically smaller grid cells are required for the shallow portion of a finite difference simulator than are required deeper in the model. The artifact generated by this approximation is an artificial reflection at the boundaries between changes in the grid cell size.

Figure 6:
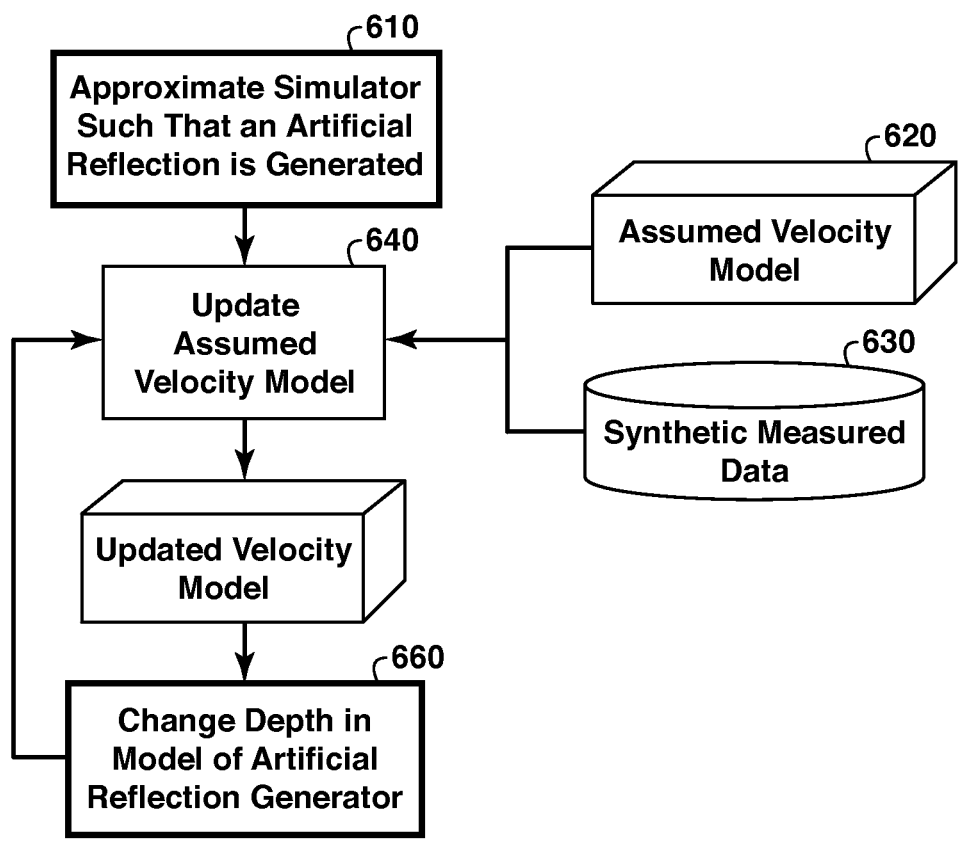
FIG. 6 is a flow chart showing basic steps in a particular embodiment of the method of FIG. 1 wherein the approximation is varying the size of the grid cells used in the numerical inversion so as to use a fine grid only where needed.

FIG. 6 is a flow chart for the embodiment of the present invention illustrated in this example. In this example, a variable grid simulator was not actually used to generate the artificial reflector. Instead (step 610) an artificial reflection is generated by placing a fictitious discontinuity in the density model at 500 meters depth. This discontinuous density model was used by the simulator for model updating, but a constant density model was used to generate the measured data (630 in FIG. 6). Inversion is then performed in a manner such that only the velocity model is updated (640), so that the fictitious density discontinuity remains throughout the iterations of inversion.

Figure 7:
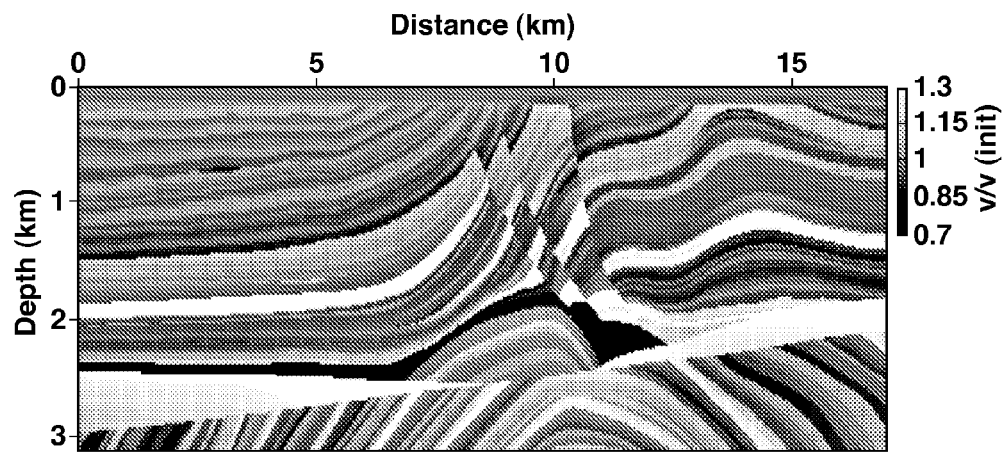
FIGS. 7-9 pertain to an example application of the invention embodiment of FIG. 6.
Figure 8:
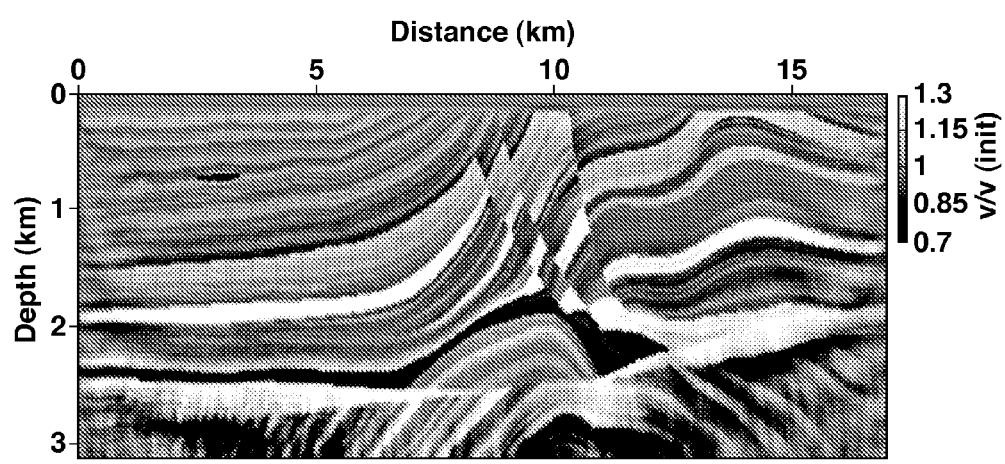

The geophysical properties model in this example is just a model (620) of the acoustic wave velocity. FIG. 7 shows the base velocity model (the model that will be inverted for and which was used to generate the data to be inverted) for this example. The shading indicates the velocity at each depth. FIG. 8 shows the inversion resulting from application of the present invention as summarized by the flow chart of FIG. 6. In this example, in step 660, the depth of the fictitious density contrast is randomly changed using a normal distribution centered on 500 meters and with a variance of 100 meters. Note the good match to the base model shown in FIG. 7. In FIGS. 7-9 and 11-13, velocity is plotted as a dimensionless relative velocity equal to the inverted velocity divided by an initial velocity, the latter being the starting guess for what the velocity model is expected to be.

Figure 9:
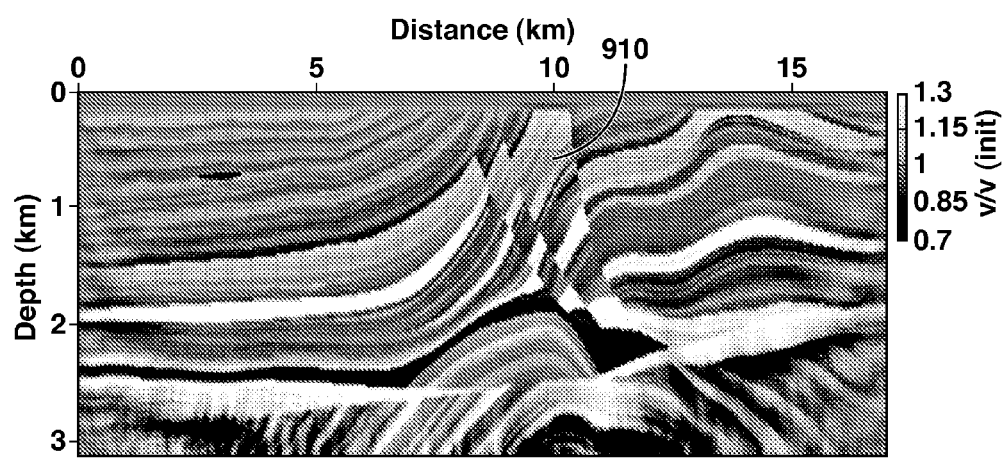

FIG. 9 shows the result of applying the inversion method outlined in the flowchart of FIG. 6, but eliminating the inventive feature that is step 660. It may be noted that the inversion in FIG. 9 has a clearly visible artificial reflection 910 at 500 meters depth, whereas this artificial reflection is largely invisible in the inversion that used the present inventive method (FIG. 8).

Test Example 3

Random Subsets of Measured Data

Figure 10:
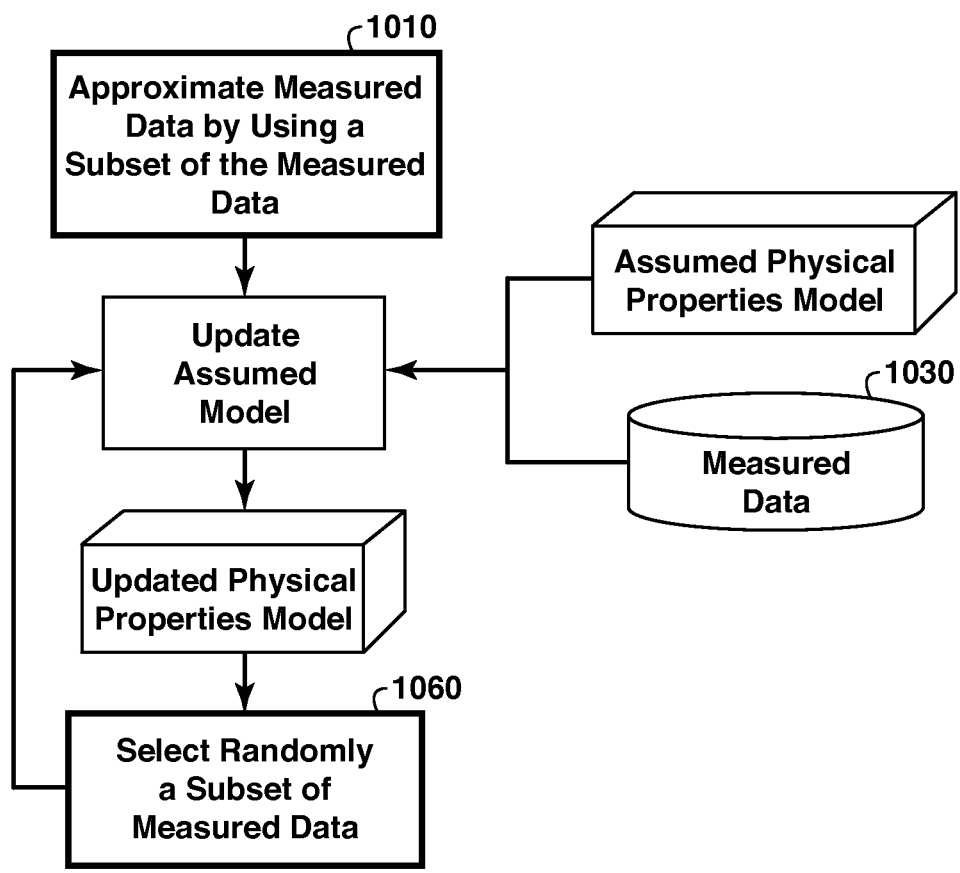
FIG. 10 is a flow chart showing basic steps in a particular embodiment of the method of FIG. 1, wherein the approximation is using only a subset of measured data.

FIGS. 10-13 represent a synthetic example of performing inversion using an approximation to the measured data. An example of such an approximation is using a subset of the measured data (1010 in FIG. 10). This approximation reduces the amount of measured data, which speeds up the inversion, because the computational time of the inversion is directly proportional to the number of measured data. In a typical inversion, all of the measured data are needed to maintain a high horizontal resolution, and thus in typical practice this approximation is not used. The artifact generated by this approximation is footprints in the inverted models caused by sparse source positions and degradation of the horizontal resolution. FIG. 10 is a flow chart that focuses the steps of FIG. 1 on the embodiment of the invention used in this example. In this example, a subset of the measured data (1030 in FIG. 10) is used in the inversion, e.g. a subset of 5 data among 50 measured data.

Figure 11:
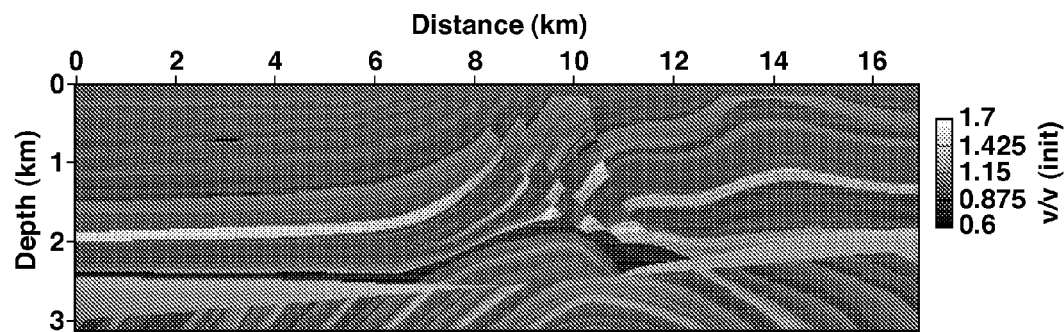
FIGS. 11-13 pertain to an example application of the invention embodiment of FIG. 10.
Figure 12:
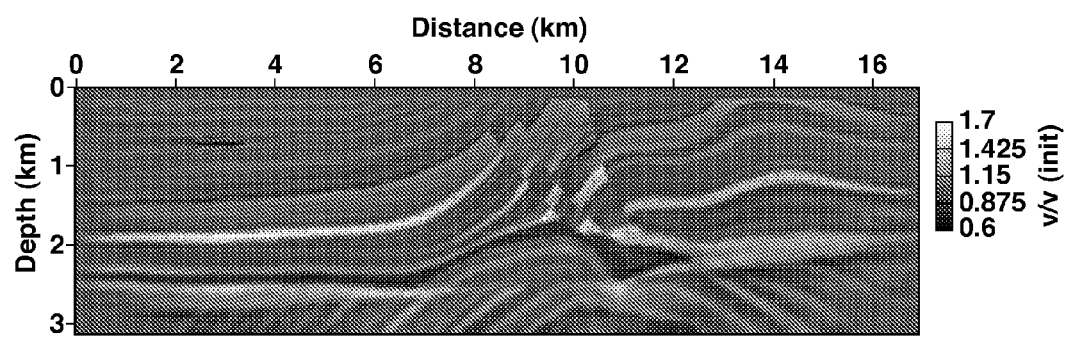

The geophysical properties model in this example is just a model of the acoustic wave velocity. FIG. 11 is the base velocity model (the model that will be inverted for and which was used to generate the data to be inverted) for this example. The shading indicates the velocity at each depth. FIG. 12 is the inversion resulting from application of this invention as summarized by the flow chart in FIG. 10. In this example, in step 1060, a subset of the measured data is randomly selected as inversion iteration increases. This results in a different subset of the data being used in each iteration cycle. FIG. 12 shows a good match to the base model shown in FIG. 11 using ten percent of the measured data.

Figure 13:
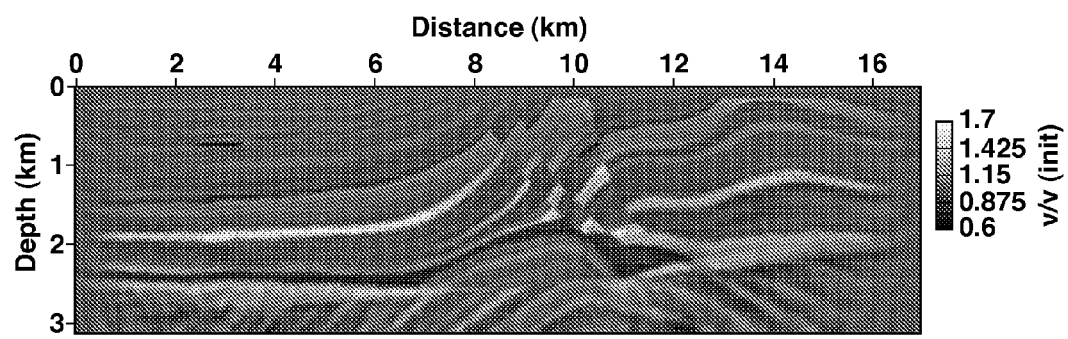

FIG. 13 shows the results of applying the inversion method outlined in the flowchart in FIG. 6, but eliminating the inventive, artifact-reducing step 1060. It may be noted that the inversion in FIG. 13 has artificial footprints at deeper parts below 2000 meters and short wavelength noises in the overall inverted model, whereas this footprint noises are mitigated in the inversion using the present inventive method (FIG. 12), and the short wavelength noises are invisible.

It should be understood that the flow charts of FIGS. 2, 6 and 10 represent examples of specific embodiments of the invention that is described more generally in FIG. 1.

The foregoing patent application is directed to particular embodiments of the present invention for the purpose of illustrating it. It will be apparent, however, to one skilled in the art, that many modifications and variations to the embodiments described herein are possible. All such modifications and variations are intended to be within the scope of the present invention, as defined in the appended claims. Persons skilled in the art will readily recognize that in practical applications of the invention, at least some of the steps in the present inventive method (typically steps 140-160, and often generating the model in 120) are performed on a computer, i.e. the invention is computer implemented. In such cases, the resulting updated physical properties model of the subsurface may either be downloaded or saved to computer storage.

REFERENCES

1. Tarantola, A., "Inversion of seismic reflection data in the acoustic approximation," Geophysics 49, 1259-1266 (1984).
2. Sirgue, L., and Pratt G. "Efficient waveform inversion and imaging: A strategy for selecting temporal frequencies," Geophysics 69, 231-248 (2004).
3. Weglein, A. B., Araujo, F. V., Carvalho, P. M., Stolt, R. H., Matson, K. H., Coates, R. T., Corrigan, D., Foster, D. J., Shaw, S. A., and Zhang, H., "Inverse scattering series and seismic exploration," Inverse Problems 19, R27-R83 (2003).
4. Fallat, M. R., Dosso, S. E., "Geoacoustic inversion via local, global, and hybrid algorithms," Journal of the Acoustical Society of America 105, 3219-3230 (1999).
5. Berkhout, A. J., "Areal shot record technology," Journal of Seismic Exploration 1, 251-264 (1992).
6. Krebs, Jerome et al., "Iterative Inversion of Data from Simultaneous Geophysical Sources", U.S. Patent Application Publication No. 2010-0018718 (Jan. 28, 2010).
7. Clapp, R. G., "Reverse time migration with random boundaries," SEG International Exposition and Meeting (Houston), Expanded Abstracts, 2809-2813 (2009).

The invention claimed is:

1. A method comprising:
using an approximation in a computer implemented iterative geophysical data inversion, wherein the approximation is other than source encoding, and the approximation is made in at least one of (i) processing or selecting measured data to invert, or (ii) parameterization of a subsurface model, or (iii) simulation of synthetic data to compare to measured data; and
varying, with the computer, the approximation in iterative cycles of the iterative geophysical data inversion, wherein the varying causes an artifact in updated subsurface models to not coherently add in leading to a final subsurface model as the iterative geophysical data inversion progresses.

2. The method of claim 1, further comprising:
identifying the artifact.

3. The method of claim 1, wherein the varying comprises selecting an aspect of the approximation that has an effect on the artifact, and varying the aspect.

4. The method of claim 1, wherein the using the approximation in the computer implemented iterative geophysical data inversion comprises using a subset of measured data as the approximation.

5. The method of claim 4, wherein the varying comprises varying the subset of the measured data in the iterative cycles of the iterative geophysical data inversion.

6. The method of claim 4, wherein the varying comprises randomly varying the subset of the measured data in the iterative cycles of the iterative geophysical data inversion.

7. The method of claim 4, wherein the varying comprises varying the subset of the measured data.

8. The method of claim 4, wherein the varying comprises randomly varying the subset of the measured data.

9. The method of claim 4, wherein the artifact is footprints of source position in an inverted model.

10. The method of claim 1, wherein the subsurface model is an acoustic wave velocity model.

11. The method of claim 1, wherein the varying includes varying the approximation for every iterative cycle of the iterative geophysical data inversion.

12. The method of claim 1, wherein the varying includes varying the approximation for consecutive iterative cycles of the iterative geophysical data inversion.

13. The method of claim 1, wherein the approximation in the computer implemented iterative geophysical data is a subset of measured data.

\* \* \* \* \*